United States Patent
Rao et al.

(10) Patent No.: US 11,157,674 B2
(45) Date of Patent: Oct. 26, 2021

(54) TRANSISTOR SIZING FOR PARAMETER OBFUSCATION OF ANALOG CIRCUITS

(71) Applicant: Drexel University, Philadelphia, PA (US)

(72) Inventors: Vaibhav Venugopal Rao, Philadelphia, PA (US); Ioannis Savidis, Wallingford, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 16/778,550

(22) Filed: Jan. 31, 2020

(65) Prior Publication Data

US 2020/0250365 A1    Aug. 6, 2020

Related U.S. Application Data

(60) Provisional application No. 62/799,525, filed on Jan. 31, 2019.

(51) Int. Cl.
   *G06F 30/373*  (2020.01)
   *G06F 30/327*  (2020.01)
   *H01L 23/00*   (2006.01)

(52) U.S. Cl.
   CPC .......... *G06F 30/373* (2020.01); *G06F 30/327* (2020.01); *H01L 23/576* (2013.01)

(58) Field of Classification Search
   USPC ....................................................... 716/100
   See application file for complete search history.

(56) References Cited

U.S. PATENT DOCUMENTS

| 2011/0309447 A1* | 12/2011 | Arghavani | .......... H01L 29/0653 257/368 |
| 2016/0171136 A1* | 6/2016 | Iskander | ............... G06F 30/367 716/106 |
| 2020/0250365 A1* | 8/2020 | Rao | ........................ G06F 30/327 |

OTHER PUBLICATIONS

Bi et al., "Beyond the Interconnections: Split Manufacturing in RF Designs", vol. 4, No. 3, Aug. 2015, pp. 541-564.
Hoe et al., "Towards Secure Analog Designs: A Secure Sense Amplifier Using Memristors", Proceedings of the IEEE Computer Society Annual Symposium on VLSI, Jul. 2014, pp. 516-521.
Rao et al., "Mesh Based Obfuscation of Analog Circuit Properties", Proceedings of the IEEE International Symposium on Circuits and Systems (ISCAS), May 2019, pp. 1-5.
Rao et al., "Transistor Sizing for Parameter Obfuscation of Analog Circuits Using Satisfiability Modulo Theory", Proceedings of the IEEE Asia Pacific Conference on Circuits and Systems (APCCAS), Oct. 2018, pp. 102-106.

(Continued)

*Primary Examiner* — Mohammed Alam
(74) *Attorney, Agent, or Firm* — Schott, P.C.

(57) ABSTRACT

An approach is described for enhancing the security of analog circuits using Satisfiability Modulo Theory (SMT) based design space exploration. The technique takes as inputs generic circuit equations and performance constraints and, by exhaustively exploring the design space, outputs transistor sizes that satisfy the given constraints. The analog satisfiability (aSAT) methodology is applied to parameter biasing obfuscation, where the width of a transistor is obfuscated to mask circuit properties, while also limiting the number of keys that produce the target performance requirements.

4 Claims, 11 Drawing Sheets

(56) References Cited

OTHER PUBLICATIONS

Juretus et al., "Securing Analog Mixed-signal Integrated Circuits Through Shared Dependencies", Proceedings of the Great Lakes Symposium on VLSI, May 2019, pp. 483-488.
Saki et al., "How Multi-threshold Designs can Protect Analog IP", Proceedings of the IEEE International Conference on Computer Design (ICCD), Oct. 2018, pp. 464-471.
Wang et al., "Thwarting Analog IC Piracy Via Combinational Locking", Proceedings of the IEEE International Test Conference (ITC), Oct. 2017, pp. 1-10.
Jayasankaran et al., "Towards Provably-secure Analog and Mixed-signal Locking Against Overproduction", Proceedings of the International Conference on Computer-Aided Design (ICCAD), Nov. 2018, pp. 1-8.
Leonhard et al., "Mixlock: Securing Mixed-signal Circuits via Logic Locking" Proceedings of the Design, Automation Test in Europe Conference Exhibition (DATE), Mar. 2019, pp. 84-89.
Jayasankaran et al., "Breaking Analog Locking Techniques via Satisfiability Modulo Theories", Proceedings of the IEEE International Test Conference (ITC), Feb. 2019, pp. 1-10.

\* cited by examiner

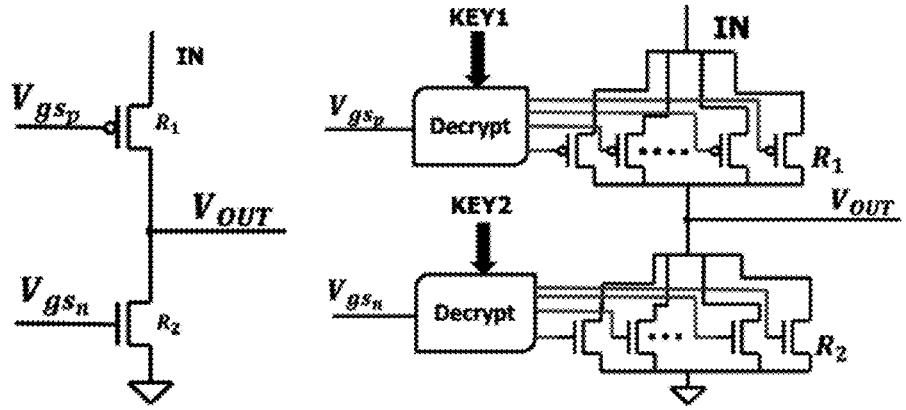

```
Algorithm 1: aSAT for transistor size optimization
  Input: circuit constraint formulae φ
  Output: S
  S=empty set
  while variable with interval greater than δ exists do
     decision ()
        pick the variable and divide the range in half
        select one of the subintervals
     deduction ()
        if ICP(φ)=UNSAT then
           find conflict-source s
           S = S ∪ s
           if S=entire state space then
              return UNSAT
           else
              undo all decision and deduction after s
              φ=φ ∩ s̄
           end if
        end if
  end while
  return UNSAT
```

FIG. 1.1C

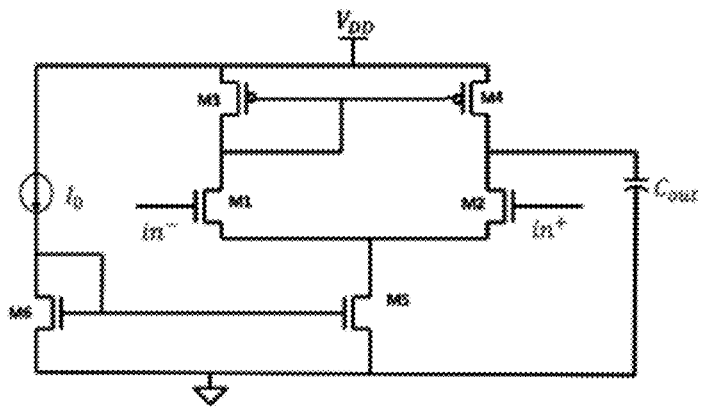

FIG. 1.2A

TABLE II: Determined W/L ratios when applying aSAT to a differential amplifier for 40 dB gain. The length for all transistors is set to 1 μm.

| Transistor | Range of W/L ratio | Selected W/L ratio |
|---|---|---|
| M1, M2 | [1, 1000] | 6.58 |
| M3, M4 | [1, 1000] | 84 |
| M5, M6 | [1, 1000] | 5.75 |

FIG. 1.2C

TABLE III: Results from SPICE simulation characterizing the performance metrics of a differential amplifier using transistor dimensions determined through aSAT.

| Performance Metrics | aSAT target Value | SPICE Value |
|---|---|---|
| $A_v$ (dB) | 40 | 35 |
| GBW (MHz) | 5 | 4.4 |
| Power dissipation (μW) | ≤ 100 | 90 |

FIG. 1.2D

TABLE IV: Determined W/L ratios when applying aSAT to a two stage amplifier for 60 dB gain. The length for all transistors is set to 1 μm.

| Transistors | Range of W/L ratio | Selected W/L ratio |
|---|---|---|
| M1, M2 | [1, 1000] | 3.2 |
| M3, M4 | [1, 1000] | 7.81 |
| M5, M6 | [1, 1000] | 7.41 |
| M7 | [1, 1000] | 165.22 |
| M8 | [1, 1000] | 70.84 |

FIG. 1.3B

TABLE I: Circuit parameter equations for a differential and two stage amplifier.

| Circuit Parameter | Dependent Parameters | Governing Equation |
|---|---|---|
| DC gain | Transconductance | $g_m = \sqrt{2\mu_n C_{ox} W/L * I_D}$ |
|  | Output conductance | $g_{ds} = 1/2 * \mu_n C_{ox} W/L * (V_{gs} - V_t)^2 * \lambda_n$ |
|  | First stage gain | $\dfrac{g_{m2}}{g_{ds2} + g_{ds4}}$ |
|  | Second stage gain | $\dfrac{g_{m7}}{g_{ds7} + g_{ds6}}$ |
|  | Total DC stage gain | $A_{DC} = \dfrac{g_{m2}}{g_{ds2}+g_{ds4}} * \dfrac{g_{m7}}{g_{ds7}+g_{ds6}}$ |
| Phase margin | Gain bandwidth | $GBW = \dfrac{g_{m1}}{2\pi C_c}$ |
|  | Zero (transfer function) | $z = \dfrac{g_{m7}}{C_1}$ |
|  | First pole (transfer function) | $P_1 = \dfrac{g_{m7}}{g_{m7} R_1 R_2 F_c}$ |
|  | Second pole (transfer function) | $P_2 = \dfrac{g_{m7}}{C_1 + C_1}$ |
|  | Phase margin | $PM = 180 - \tan^{-1}\left(\dfrac{GBW}{P_1}\right) - \tan^{-1}\left(\dfrac{GBW}{z}\right) - \tan^{-1}\left(\dfrac{GBW}{P_2}\right)$ |

FIG. 1.2B

TABLE V: Results from SPICE simulation of a two-stage amplifier using transistor dimensions determined through aSAT to characterize target performance metrics.
| Performance Metrics | aSAT target Value | SPICE value |
|---|---|---|
| $A_v$ (dB) | 60 | 63.02 |
| GBW (MHz) | 30 | 23 |
| Phase margin (°) | $40° \geq PM \geq 60°$ | 49.77 |
| Power dissipation ($\mu W$) | $\leq 300$ | 206.8 |
FIG. 1.3C
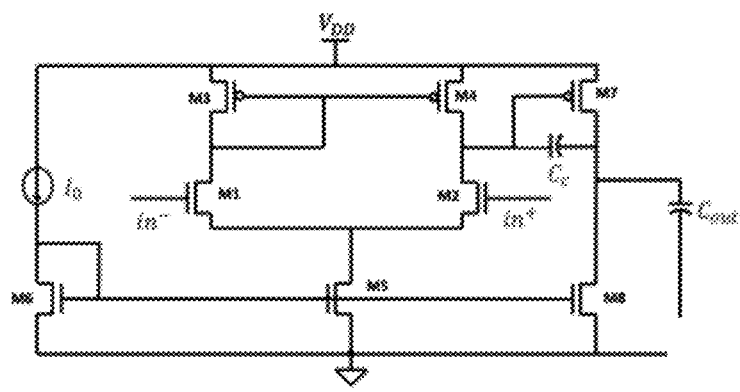
FIG. 1.3A

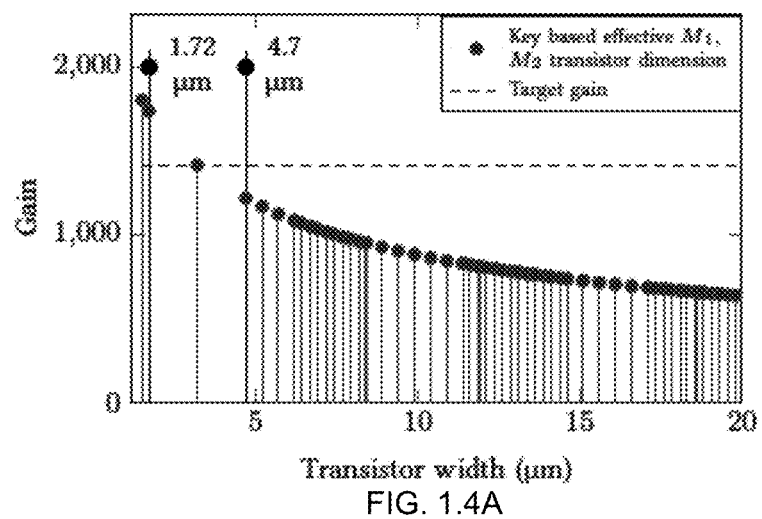
FIG. 1.4A
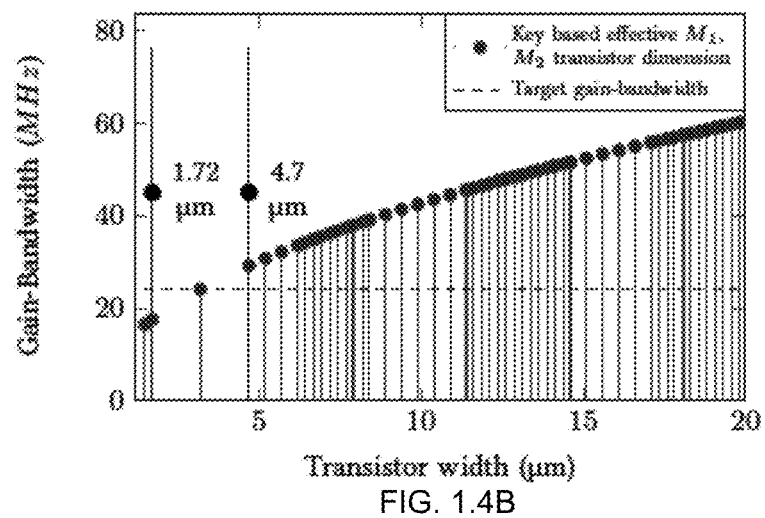
FIG. 1.4B

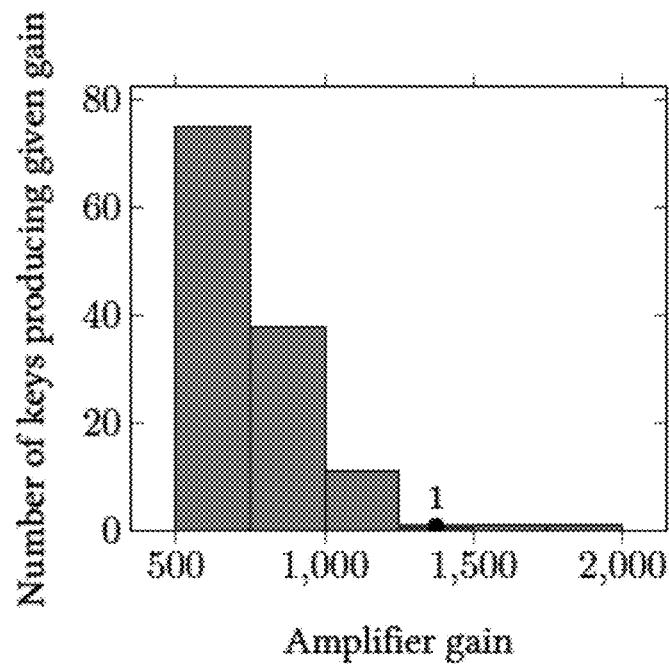
FIG. 1.5A
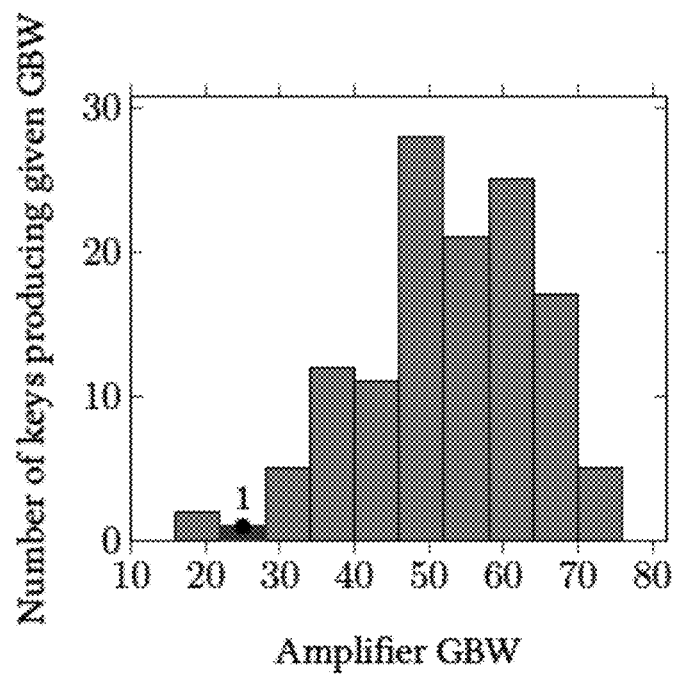
FIG. 1.5B

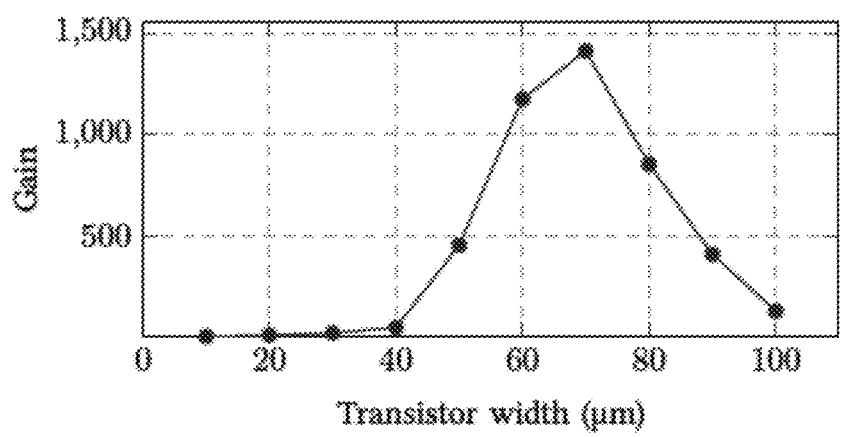
FIG. 1.6

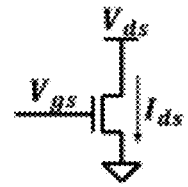

FIG. 2.1A

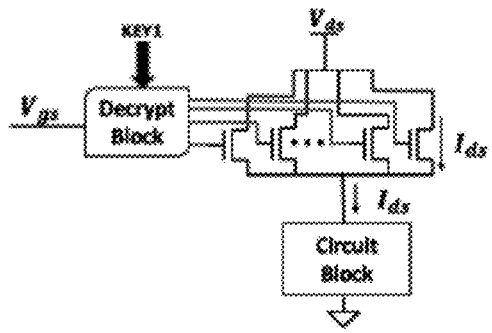

FIG. 2.1B

---
Algorithm 2.1 Width Estimation Algorithm
---
given:
   circuit constraint formulae $\phi$;
   $S$ = empty solution set;
while solution $\neq$ UNSAT do
   construct interval $[solution - \Delta, solution + \Delta]$;
   $S = S \cup [solution - \Delta, solution + \Delta]$;
   $\phi = \phi \wedge (x, y) \notin [solution - \Delta, solution + \Delta]$;
   Check for Satisfiability;
end while
return $S$;

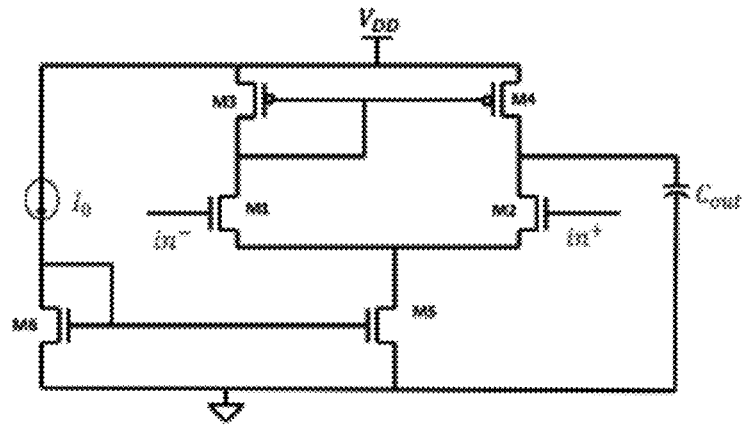
FIG. 2.2A
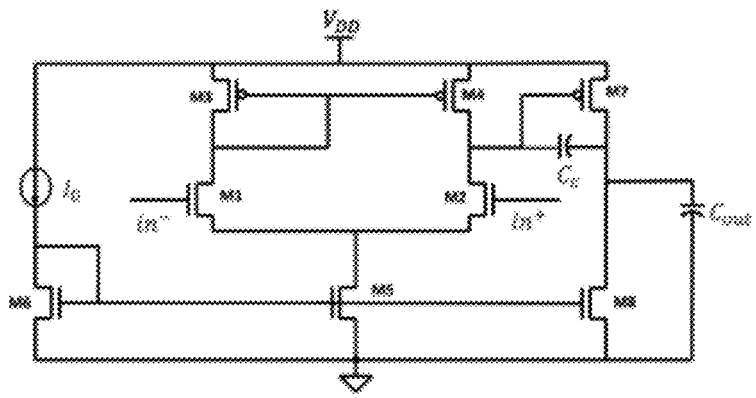
FIG. 2.3A
Table VII  Determined W/L ratio when applying aSAT to a operational amplifier for 60 dB gain.
| Parameter | Range of W/L Ratio | Selected W/L Ratio |
|---|---|---|
| M1, M2 | [1, 1000] | 3.62 |
| M3, M4 | [1, 1000] | 7.81 |
| M5, M6 | [1, 1000] | 7.41 |
| M7 | [1, 1000] | 117.81 |
| M8 | [1, 1000] | 55.88 |
FIG. 2.3B Table VI  Comparision of transistor dimensions determined through aSAT with SPICE simulation for different performance metrics.

| Performance Metrics | aSAT target Value | SPICE Value |
|---|---|---|
| $A_v$ (dB) | 40 | 35 |
| GBW (MHz) | 5 | 4.4 |
| Power Dissipation ($\mu W$) | $\leq 100$ | 90 |

FIG. 2.2B

Table VIII Accuracy of transistor dimensions determined through aSAT for different performance metrics.
| Performance Metrics | aSAT target Value | SPICE Value |
|---|---|---|
| $A_v$ (dB) | 60 | 63.02 |
| GBW (MHz) | 30 | 23 |
| Phase Margin (°) | $40° \geq PM \geq 60°$ | 49.77 |
| Power Dissipation ($\mu W$) | $\leq 300$ | 206.8 |
FIG. 2.3C
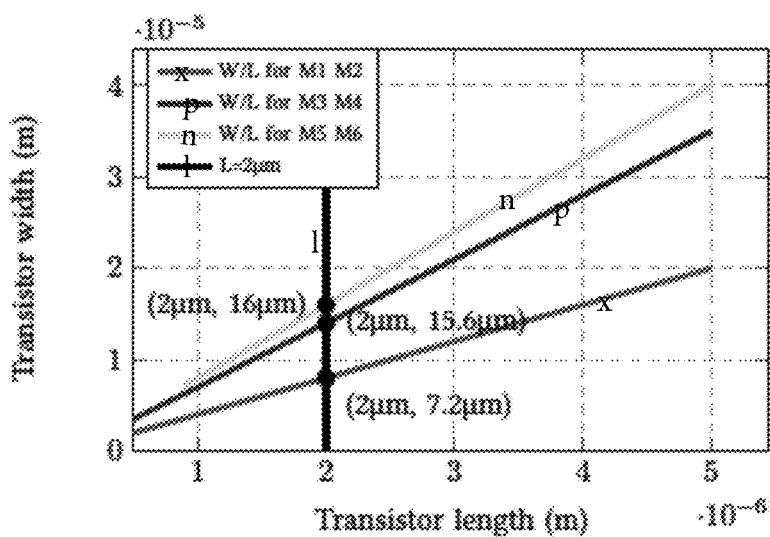
FIG. 2.4

TRANSISTOR SIZING FOR PARAMETER OBFUSCATION OF ANALOG CIRCUITS

STATEMENT REGARDING GOVERNMENT SUPPORT

This invention was made with government support under Contract Nos. CNS 1648878 and CNS 1751032 awarded by the National Science Foundation. The government has certain rights in the invention.

BACKGROUND

Parameter obfuscation is a key-based technique that targets the physical dimensions of the transistors used to set the optimal biasing conditions of the circuit. The width and length of a transistor may be obfuscated and, based on an applied key sequence, provides a range of potential biasing points. Only when the correct key sequence is applied and certain transistor(s) are active, are the correct biasing conditions at the target node set.

A typical voltage biasing circuit is shown in FIG. 1.1A. For the obfuscated biasing circuit, the resulting output resistances may be directly proportional to the combined width of the active transistors from the set of parallel transistors comprising the obfuscated devices of the original biasing circuit, as shown in FIG. 1.1B. Only on application of the correct key sequences KEY1 and KEY2 are the proper transistor widths selected and, therefore, the proper resistances set. When the correct resistances are set, the desired Vout may be obtained. The technique may be applicable to the obfuscation of other width and length dependent circuit parameters including currents, capacitance, phase noise, bandwidths, frequencies, and gains.

SUMMARY OF THE EMBODIMENTS

To overcome such design overhead, a technique based on satisfiability modulo theory (SMT) is shown herein for design space exploration to automatically determine transistor widths such that only a limited number of keys produce the correct operating conditions. The technique herein results in fast and accurate design of analog circuits that include obfuscated transistor sizes for security.

BRIEF DESCRIPTION OF THE DRAWINGS

FIG. 1.1A shows an unobfuscated typical voltage biasing circuit.

FIG. 1.1B shows an obfuscated typical voltage biasing circuit.

FIG. 1.1C shows Algorithm 1.

FIG. 1.2A shows a circuit diagram of a differential amplifier.

FIG. 1.2B shows Table I.
FIG. 1.2C shows Table II.
FIG. 1.2D shows Table III.
FIG. 1.3A shows a two-stage amplifier.
FIG. 1.3B shows Table IV.
FIG. 1.3C shows Table V.

FIGS. 1.4A and 1.4B show plots of the gain and gain-bandwidth with respect to the applied keys, and therefore effective transistor widths, respectively.

FIGS. 1.5A and 1.5B show histograms of gains and gain-bandwidths for a two-stage amplifier.

FIG. 1.6 shows a graph of transistor width vs gain of the exemplary amplifier.

FIGS. 2.1A and 2.1B show a current bias circuit unobfuscated and obfuscated respectively.

FIG. 2.1C shows Algorithm 2.1.

FIG. 2.2A shows a circuit diagram of an exemplary differential amplifier.

FIG. 2.2B shows Table VI.

FIG. 2.3A shows the topology of an implemented operational amplifier.

FIG. 2.3B shows Table VII.
FIG. 2.3C shows Table VIII.

FIG. 2.4 shows the transistor widths as a function of transistor lengths for the performance specifications listed in column 2 of Table VII and the W/L ratios obtained from Table IV.

DETAILED DESCRIPTION OF THE EMBODIMENTS

1. Transistor Sizing for Parameter Obfuscation of Analog Circuits Using Satisfiability Modulo Theory

1.1 Introduction

The system and method herein describe the development of an efficient SMT design space exploration methodology for analog circuits that implement parameter obfuscation. The technique determines transistor sizes for a given set of performance constraints and transistor dimensional bounds (i.e. a range of valid transistor widths and lengths). The transistor sizing technique may be applied to the design of both a differential amplifier and a two-stage amplifier. The parameter obfuscation technique may be applied to the two-stage amplifier to mask the gain and gain-bandwidth.

1.2 Analog Satisfiability (aSAT) for Design Space Exploration

Satisfiability based verification for analog and mixed signal (AMS) circuits has gained significant importance due to the development of powerful (satisfiability) SAT solvers. The SAT based techniques provide both the capacity and the efficiency required to solve linear as well as non-linear equations with interval arithmetic constraints.

1.2.1 Problem Formulation

The satisfiability technique uses equations such as for gain, operating frequency, phase noise, and bandwidth to determine transistor sizes that meet the given circuit constraints and specifications. The range of widths and lengths along with the circuit constraints may be used as inputs to the aSAT solver. The general formulation of the SAT problem is written as $$X_{min} \leq X \leq X_{max},$$
$$Y_{pmin} \leq Y_p \leq Y_{pmax}, \quad (1)$$
$$y_j = f(x_i)$$

Where $[X_{min}; X_{max}]$ is the range of transistor dimensions, $[Y_{pmin}; Y_{pmax}]$ are the ranges of the circuit constraints, $X = \{x_i = 1 \ldots n\}$ are the transistor sizes (length and width) for n number of transistors, $Y_p\{y_j = 1 \ldots m\}$ are the m number of performance parameters, $y_j = f(X); j = 1 \ldots n$ are the mapping equations from X to Y, and p is the index representing each individual constraint.

1.2.2 SAT Algorithm

The use of SMT to determine the widths of transistors for a given set of analog circuit constraints is described by Algorithm 1, shown in FIG. 1.1C. The constraint formula φ is an input to the SMT solver along with technology dependent parameters. The satisfiability of a circuit topology using an SMT solver begins by first selecting a random width and performance range (X, Y) for each circuit node along with the corresponding interval range in the decision process. The SMT solver selects one of the unassigned variables and splits the interval of the variable into two subintervals of the same length. The solver temporarily discards one of the subintervals and reduces the range of the selected interval. The interval constraint propagation (ICP) technique is then applied to φ. If the ICP routine terminates with no conflict, then the algorithm returns to the decision step. If a conflict exists in the interval due to a reduction of a variable to null, the source of the decision that lead to the conflict is located by the conflict driven clause learning (CDCL) algorithm. When the union of conflict sources covers the entire search space, the algorithm returns UNSAT. Otherwise, a backtrack routine is called and the algorithm returns to the decision process after adding a conflict clause to φ. The union of all the intervals is the superset of the solution space.

1.2.3 Application To Parameter Biasing Obfuscation

The two main challenges that arise in parameter biasing obfuscation are:
1) multiple correct keys (multiple widths and lengths that produce the desired circuit response) and
2) the limited deviation in the performance of a circuit when an incorrect key is applied. The challenges are addressed through aSAT analysis by 1) formulating an SMT problem based on the optimized transistor widths that meet the desired circuit specifications, 2) accounting for the number of obfuscated transistors, and 3) accounting for the permitted range of transistor sizes. The constraints for the SMT problem limit the number of effective widths close to the target width, which are set by the applied key. The formulated SMT problem and the given constraints are provided as inputs to the aSAT solver, which then outputs the transistor sizes that limit the number of correctly functioning keys.

1.3 Applying aSAT for Transistor Sizing To Meet Circuit Constraints

The aSAT design methodology may be applied to a differential amplifier and a two-stage amplifier. All parameter selections based on aSAT solutions are obtained using iSAT3, which is a satisfiability checker for Boolean combinations of arithmetic constraints for both real and integer valued variables. iSAT3 is capable of solving linear, non-linear arithmetic, and transcendental functions. The widths and lengths obtained from the aSAT solver are then validated through SPICE simulation of the amplifier in a 180 nm CMOS process.

1.3.1 Applying aSAT for Transistor Sizing of a Differential Amplifier

A differential amplifier topology is shown in FIG. 1.2A. To highlight the adaptability of the aSAT algorithm in solving constraint driven equations, ranges of transistor widths and lengths are inputted into the aSAT solver. The algorithm exhaustively and simultaneously explores both transistor width and length ranges and outputs transistor dimensions that satisfy the performance constraints. Using the equations listed in Table I (FIG. 1.2B) as circuit constraints, the problem is formulated and inputted into the aSAT solver. The transistor sizes (W/L ratio) determined through execution of the aSAT solver for an examplary differential amplifier with a gain of 40 dB, gain bandwidth of 5 MHz, slew rate of 5V/μm2, load capacitance Cout of 10 pF, input common mode voltage range between 0.8 V to 1.6 V, and power dissipation of less than 100 μW are listed in Table II (FIG. 1.2C). The differential amplifier with transistor sizes obtained from the aSAT solver were characterized with SPICE simulation, and the resulting performance metrics compared against target circuit specifications. The results of the comparison are listed in Table III (FIG. 1.2D). The simulated results indicate that all the design constraints including the gain, gain bandwidth, and power dissipation were within 15% of the target values. Further improvement in the accuracy of the aSAT determined transistor sizes may be possible by including parasitic models of the circuit as additional constraints.

1.3.2 Applying aSAT for Transistor Sizing of a Two Stage Amplifier

The two-stage amplifier topology shown in FIG. 1.3 is considered. The supply voltage Vdd in this example may be set to 1.8 V and the load capacitance Cout set to 2 pF. The input common mode voltage range is set between 0.8 V and 1.6 V to ensure the transistors operate in saturation. To ensure the stability of the circuit and to maintain the required phase margin, Cc is set to the smallest value greater than 0.22 Cout. Applying the circuit equations for a two-stage amplifier (listed in Table I (FIG. 1.2B)), while setting target values for additional parameters including the input common mode range (ICMR), slew rate, and power dissipation for transistors constrained to operate in saturation, the problem is formulated (circuit constraint equations) and inputted into the aSAT solver. The resulting transistor sizes (W/L ratio) generated by the aSAT solver for the two stage amplifier given a performance target of 60 dB gain, 30 MHz gain-bandwidth, and power dissipation of less than 300 μW are listed in Table IV (FIG. 1.3B). The transistor sizes obtained from the aSAT solver are then characterized with SPICE simulation. The performance metrics of the simulated two stage amplifier with widths determined through aSAT analysis are compared against target circuit specifications. The results of the comparison are listed in Table V (FIG. 1.3C). The simulated results indicate that the gain, phase margin, and power dissipation constraints are all within the targeted specifications. However, there is a 7 MHz drop in the gain and width of the amplifier.

1.4 Applying aSAT to Determine Transistor Sizes of the Two Stage Amplifier that Result in a Unique Key The parameter obfuscation technique is applied to the two-stage amplifier circuit shown in FIG. 1.3A. Each of M1 and M2 is obfuscated using a seven parallel transistor topology, while M8 is obfuscated using 10 parallel transistors. Therefore, the two-stage amplifier is obfuscated using a 24-bit key that masks the gain and gain-bandwidth parameters. Obfuscation of M1 and M2 masks the first-stage gain and gain-bandwidth, while the obfuscation of M8 masks the second-stage gain of the amplifier.

Analysis was performed characterizing both the gain and gain-bandwidth with respect to the applied keys, and therefore effective transistor widths, with results plotted in FIGS. 1.4A and 1.4B respectively. The results shown verify that only one key exists that produces the target width, and therefore, the desired gain of 63 dB (1415×), while all other keys result in widths that produce at least 14% variation (2 dB) in gain. Although the next closest incorrect key produces only a 2 dB deviation in the gain, there is also a deviation of at least 20% in the gain-bandwidth. In addition, the target gain and gain-bandwidth are not the individually optimized values. As seen from FIGS. 1.4A and 1.4B, the gain and the gain-bandwidth parameters are inversely related as a function of width. The result is an increase in the difficulty of an attacker determining the transistor widths that properly set the gain and gain-bandwidth as the keys produce either higher gain but lower gain-bandwidth or lower gain but higher gain-bandwidth.

The obfuscated two stage amplifier is characterized by applying all key combinations (seven key bits for M1 and M2), with results shown in FIGS. 1.5A and 1.5B. The histograms indicate that there exists only one key sequence that results in the desired 63 dB (1415×) gain and 23 MHz gain-bandwidth, which fall within the target range of 62 dB (1250×) to 63.5 dB (1500×) and 22 MHz to 28 MHz, respectively. The above analysis indicates that the aSAT solver generates a limited number of keys within a small range of the target gain and gain-bandwidth, which better masks both the first-stage gain and gain-bandwidth.

Obfuscation of M8 with 10 parallel transistors masks the second stage gain. The total gain of the amplifier as a function of the width of M8 is shown in FIG. 1.6. Applying the aSAT design methodology, transistor sizes are determined such that an incorrect key results in a transistor width that varies by at least 20% of the target width, and therefore, results in at least a 4 dB (37%) degradation of the amplifier gain. The two-stage amplifier obfuscated using a 24-bit key results in an 80% overhead in area. However, the probability of determining the correct key is 5.96×10−08, which secures the amplifier design from reverse engineering and IP theft.

1.5 Conclusion

An SMT based aSAT algorithm reduces the design time of analog circuits while implementing parameter obfuscation. The aSAT algorithm is applied to a differential amplifier and a two-stage amplifier to determine the transistor dimensions that satisfy the specified performance constraints while also meeting the constraints imposed by implementation of the parameter obfuscation technique. For the differential amplifier and the two-stage amplifier, the W/L transistor ratios determined through aSAT analysis met the gain, phase margin, and power consumption requirements of the circuit. However, for the two-stage amplifier, a reduction of 7 MHz in the gain-bandwidth was observed.

A novel security oriented analog design methodology, specifically parameter-based obfuscation, may be implemented on a two-stage amplifier that is secured with a 24 bit key. The aSAT algorithm may be applied to automatically determine obfuscated transistor sizes for the two stage amplifier such that only a limited number of keys produce the correct operating conditions. The implementation of the parameter obfuscation technique along with the transistor sizes generated by the aSAT as shown above shows an 80% increase in area. Since only one key produces the correct circuit functionality, the probability to determine the correct key is 5.96×10−08. The methodologies described herein reduce the time to design analog circuits while also securing against IC theft, reverse engineering, and counterfeiting.

2. Security Oriented Analog Circuit Design Using Satisfiability Modulo Theory Based Search Space Exploration

2.1 Parameter Obfuscation

Parameter obfuscation is a key-based technique that targets the physical dimensions of the transistors used to set the optimal biasing conditions. The width of a transistor is obfuscated and, based on an applied key sequence, provides a range of potential biasing points. Only when the correct key sequence is applied and certain transistor(s) are active, are the correct biasing conditions at the target node set.

A typical current biasing circuit is shown in FIG. 2.1A. The equivalent obfuscated current biasing circuit is shown in FIG. 2.1B, where transistors produce currents that are directly proportional to the combined width of the active transistors from the set of parallel transistors. Only on application of the correct key sequence KEY1 are the proper transistor widths selected and, therefore, the proper currents set. When the correct currents are set, the desired Iout is obtained.

The technique is applicable to the obfuscation of other width and length dependent circuit parameters including currents, voltages, resistances, capacitances, phase noise, bandwidths, and gains.

2.2 Analog Satisfiability (aSAT) for Design Space Exploration

Satisfiability based verification for analog and mixed signal (AMS) circuits has gained significant importance due to the development of powerful SAT solvers. The SAT based techniques provide both the capacity and the efficiency required for solving linear as well as non-linear equations with interval arithmetic constraints.

2.2.1 Problem Formulation

The satisfiability technique may use generic analog circuit design equations such as for gain, operating frequency, phase noise, and bandwidth to determine transistor sizes that meet the given circuit constraints and specifications. The range of widths and lengths along with the circuit constraints are inputs to the aSAT solver. The general formulation of the SAT problem is written as EQ. 1, above.

2.2.2 SAT Algorithm

The use of SAT to determine the widths of transistors for a given set of analog circuit constraints may be specifically described by Algorithm 2.1 (FIG. 2.1C). The SAT solver begins by choosing a random width and performance range (X, Y) for each circuit node with interval [solution Δ, solution+Δ]. Guidance constraints (x, y)/[solution Δ, solution+Δ] are added, which force the algorithm to search for solutions beyond the interval. If a new solution is found by the SAT solver, the solution is used to construct new performance and guidance intervals that include the satisfied conditions from the current guidance interval. The step of updating the performance ranges and guidance interval is continued until the solver returns UNSAT. The union of all the intervals is the superset of the solution space.

The objective of the parameter space exploration algorithm is to determine a feasible performance space and transistor operating range for the given constraints and specifications. The cost of solving SMT based circuit equations increases exponentially with increasing constraints or with wider parameter ranges. Large dimensions lead to a large initial performance space, which is computationally expensive to search. To address the increased computational cost, the large ranges (transistor dimensions) are sub-divided into smaller ranges. The aSAT algorithm is then applied to each individual sub-space. The benefit of sub-dividing the design space is that each sub-domain is run independently and in parallel, which decreases the computational time.

2.3 Applying aSAT For Transistor Sizing

To highlight the adaptability of the aSAT algorithm in solving constraint driven equations, the aSAT design methodology is applied to a differential amplifier and an operational amplifier. All parameter selections based on aSAT solutions are obtained using iSAT3 [7]. The widths and lengths obtained from the aSAT solver are then validated through SPICE simulation using a 180 nm CMOS process.

2.4.1 Application of aSAT to a Differential Amplifier

The differential amplifier topology considered herein is shown in FIG. 2.2A. Using the equations listed in Table I as circuit constraints, the problem is formulated and inputted into the aSAT solver. The transistor sizes (W/L ratio) determined through execution of the aSAT solver for a differential amplifier with a gain of 40 dB, gain bandwidth of 5 MHz, slew rate of 5V/μm2, load capacitance Cout of 10 pF, input common mode voltage range of 0.8 V to 1.6 V, and power dissipation of less than 100 μW are listed in Table II. The differential amplifier with transistor sizes obtained from the aSAT solver is then characterized with SPICE simulation, and the resulting performance metrics are compared against target circuit specifications. The results of the comparison are listed in Table VI (FIG. 2.2B).

2.4.2 Application of aSAT to an Operational Amplifier

The topology of the implemented operational amplifier is shown in FIG. 2.3A. The supply voltage Vdd was set to 1.8 V and the load capacitance Cout is set to 2 pF. The input common mode voltage range was set between 0.8 V and 1.6 V to ensure the transistors remain in saturation. To ensure the stability of the circuit and in order to maintain the phase margin requirements, Cc was set to the smallest value greater than 0.22 Cout. Using the equations listed in Table I, while considering additional parameters including input common mode range (ICMR), slew rate, and power dissipation with transistors constrained to operate in saturation, the problem is formulated (circuit constraint equations) and inputted into the aSAT solver. The transistor sizes (W/L ratio) determined through the execution of the aSAT solver for an operational amplifier with a gain of 60 dB, gain bandwidth of 30 MHz, and power dissipation of less than 300 μW are listed in Table VI (FIG. 2.3B). The operational amplifier with transistor lengths and widths determined through aSAT analysis is then characterized with SPICE simulation. The performance metrics of the simulated operational amplifier are compared against targeted circuit specifications, with the results of the comparison listed in Table VII (FIG. 2.3C). The results of the SPICE simulation indicate that the gain, phase margin, and power dissipation constraints are all within the targeted specifications. However, there is a 7 MHz drop in the gain bandwidth product of the amplifier.

The transistor widths as a function of transistor lengths for the performance specifications listed in column 2 of Table VII and the W/L ratios obtained from Table IV are plotted in FIG. 2.4. By setting the transistor length to a specific value, only a limited set of widths for transistors M1 through M6 exist that meet the target specifications. The obfuscated transistor sizes are set such that only one combination produces the desired circuit operation for a selected length, as shown in FIG. 2.4.

2.5 Conclusion

A security oriented analog circuit design methodology is described. The aSAT algorithm provides topology independent results as generic analog circuit equations are solved. The aSAT algorithm was implemented on a differential amplifier and an operational amplifier to determine the transistor dimensions that satisfy the specified performance constraints. For the operational amplifier, the W/L transistor ratios determined through aSAT analysis were found to meet the gain, phase margin, and power consumption requirements of the circuit, but a reduction of 7 MHz in gain bandwidth was observed. The simulated results indicate that the aSAT methodology are an accurate technique to reduce design time for analog circuits that include obfuscated transistors for security.

While the invention has been described with reference to the embodiments described herein, a person of ordinary skill in the art would understand that various changes or modifications may be made thereto without departing from the scope of the claims.

The invention claimed is:
1. A method for parameter obfuscation of an analog circuit comprising sizing a transistor using analog satisfiability (aSAT) applied to parameters, wherein the circuit property width of the transistor is obfuscated, wherein the transistor sizing is done using the following aSAT aglorithm:
a constraint formula φ is an input to a satisfiability modulo theory (SMT) solver along with technology dependent parameters;
the satisfiability of a circuit topology using the SMT solver begins by first selecting a random width and performance range (X, Y) for a circuit node along with the corresponding interval range in the decision process;
the SMT solver selects one of the unassigned variables and splits the interval of the variable into two subintervals of the same length;
the solver temporarily discards one of the subintervals and reduces the range of the selected interval;
an interval constraint propagation (ICP) technique is then applied to φ, wherein, If the ICP routine terminates with no conflict, then the algorithm returns to the decision step, and if a conflict exists in the interval due to a reduction of a variable to null, the source of the decision that lead to the conflict is located by the conflict driven clause learning (CDCL) algorithm;
when a union of conflict sources covers an entire search space, the algorithm returns UNSAT, otherwise, a back- track routine is called and the aSAT algorithm returns to the decision process after adding a conflict clause to $\varphi$; and the union of all the intervals is the superset of the solution space.

2. The method of claim 1, wherein the analog circuit is a differential amplifier.

3. The method of claim 1, wherein the analog circuit is a two-stage amplifier.

4. The method of claim 1, wherein the analog circuit is an operational amplifier.

* * * * *